US011385074B2

(12) United States Patent
Schamber

(10) Patent No.: US 11,385,074 B2
(45) Date of Patent: Jul. 12, 2022

(54) PROGRAMMING ELECTRIC METER GLOBAL POSITIONING SYSTEM COORDINATES USING SMART DEVICE

(71) Applicant: Landis+Gyr Innovations, Inc., Alpharetta, GA (US)

(72) Inventor: David Schamber, Lafayette, IN (US)

(73) Assignee: LANDIS+GYR INNOVATIONS, INC., Alpharetta, GA (US)

( * ) Notice: Subject to any disclaimer, the term of this patent is extended or adjusted under 35 U.S.C. 154(b) by 0 days.

(21) Appl. No.: 16/823,106

(22) Filed: Mar. 18, 2020

(65) Prior Publication Data

US 2021/0293576 A1 Sep. 23, 2021

(51) Int. Cl.
*G01D 4/00* (2006.01)
*G01R 22/06* (2006.01)
*G06Q 50/06* (2012.01)

(52) U.S. Cl.
CPC .......... *G01D 4/002* (2013.01); *G01R 22/065* (2013.01); *G06Q 50/06* (2013.01)

(58) Field of Classification Search
CPC ................................... G01D 4/002
USPC .......................................... 702/61
See application file for complete search history.

(56) References Cited

U.S. PATENT DOCUMENTS

| 6,615,147 | B1 | 9/2003 | Jonker et al. |
| 6,816,360 | B2 | 11/2004 | Brooksby et al. |
| 7,135,850 | B2 | 11/2006 | Ramirez |
| 7,469,190 | B2 | 12/2008 | Bickel |
| 7,693,670 | B2 | 4/2010 | Durling et al. |
| 7,990,806 | B2 | 8/2011 | Chen |
| 8,004,933 | B2 | 8/2011 | Iseli |
| 8,121,741 | B2 | 2/2012 | Taft et al. |
| 8,223,466 | B2 | 7/2012 | Roscoe |
| 8,248,269 | B1* | 8/2012 | Boyd ............ H04Q 9/00 340/870.03 |
| 8,322,215 | B2 | 12/2012 | Lakich et al. |
| 8,326,554 | B2 | 12/2012 | Caird |
| 8,635,036 | B2 | 1/2014 | Pamulaparthy et al. |
| 8,754,634 | B2 | 6/2014 | Chamarti et al. |

(Continued)

FOREIGN PATENT DOCUMENTS

| EP | 1584898 | 10/2005 | |
| WO | WO-2013136295 A1 * | 9/2013 | ............. G01D 4/008 |

(Continued)

OTHER PUBLICATIONS

International Patent Application No. PCT/US2021/020883, International Search Report and Written Opinion dated Jun. 2, 2021, 12 pages.

*Primary Examiner* — Ricky Go
(74) *Attorney, Agent, or Firm* — Kilpatrick Townsend & Stockton LLP

(57) ABSTRACT

A method for programming global positioning system (GPS) coordinates for a smart meter includes receiving, by a server remote from the smart meter, an image file of a photograph of the smart meter; recognizing identification information of the smart meter from the image file; extracting GPS coordinates from metadata of the received image file; transmitting the GPS coordinates and instructions to store the GPS coordinates to the smart meter identified by the identification information; and storing, by a processor of the smart meter, the GPS coordinates in a memory of the smart meter.

20 Claims, 10 Drawing Sheets

(56) References Cited

U.S. PATENT DOCUMENTS

| | | | |
|---|---|---|---|
| 8,830,083 B2 | 9/2014 | LaFrance et al. | |
| 8,854,217 B2 | 10/2014 | Brown et al. | |
| 8,947,246 B2 | 2/2015 | Aiken | |
| 8,978,443 B2 | 3/2015 | Ramirez | |
| 8,996,144 B2 | 3/2015 | LaFrance et al. | |
| 9,164,135 B2 | 10/2015 | Cs et al. | |
| 9,304,014 B2 | 4/2016 | Komati et al. | |
| 9,341,686 B2 | 5/2016 | Deak et al. | |
| 9,383,225 B2 * | 7/2016 | Bolick | G01D 4/008 |
| 9,476,740 B2 | 10/2016 | Zigovszki et al. | |
| 9,557,392 B2 | 1/2017 | Schuhl et al. | |
| 9,602,895 B2 | 3/2017 | Bowling et al. | |
| 9,671,254 B2 | 6/2017 | Zigovszki et al. | |
| 9,887,051 B2 | 2/2018 | LaFrance et al. | |
| 9,891,088 B2 | 2/2018 | Zigovszki et al. | |
| 9,927,257 B2 * | 3/2018 | Dubs | G06K 9/00624 |
| 10,240,961 B2 | 3/2019 | Cheng et al. | |
| 10,254,315 B2 | 4/2019 | Higashi et al. | |
| 10,295,578 B2 | 5/2019 | Higashi et al. | |
| 2005/0246295 A1 * | 11/2005 | Cameron | G01D 4/004 |
| | | | 705/412 |
| 2008/0150751 A1 * | 6/2008 | Sala | G01D 4/00 |
| | | | 340/870.02 |
| 2012/0284096 A1 * | 11/2012 | Gomes | G01D 4/002 |
| | | | 705/14.14 |
| 2013/0060395 A1 | 3/2013 | Burke et al. | |
| 2014/0232553 A1 | 8/2014 | Venkatraman et al. | |
| 2014/0344796 A1 * | 11/2014 | Lavoie | G06F 8/66 |
| | | | 717/168 |
| 2017/0358041 A1 | 12/2017 | Forbes, Jr. et al. | |
| 2018/0020270 A1 | 1/2018 | Colonna et al. | |
| 2018/0073910 A1 | 3/2018 | Deak et al. | |
| 2018/0106640 A1 | 4/2018 | Rones et al. | |
| 2019/0041439 A1 | 2/2019 | Brown | |
| 2019/0094329 A1 | 3/2019 | Minich | |
| 2019/0101411 A1 | 4/2019 | Davis et al. | |
| 2019/0123580 A1 | 4/2019 | Bindea et al. | |
| 2019/0219618 A1 | 7/2019 | Davis et al. | |

FOREIGN PATENT DOCUMENTS

| | | |
|---|---|---|
| WO | 2018072030 | 4/2018 |
| WO | 2018083902 | 5/2018 |
| WO | 2019026791 | 2/2019 |

* cited by examiner

PROGRAMMING ELECTRIC METER GLOBAL POSITIONING SYSTEM COORDINATES USING SMART DEVICE

BACKGROUND

Unless otherwise indicated herein, the materials described in this section are not prior art to the claims in this application and are not admitted to be prior art by inclusion in this section.

An electric meter measures electrical power consumed by a customer of an electric utility provider. The electric meter is plugged into a meter socket that is mounted in an enclosure on a building or other structure. Advanced Metering Infrastructure (AMI) electric meters, also known as smart meters, are updated, digital versions of the traditional electrical meter. A smart meter records consumption of electric energy and communicates the information to the utility provider for monitoring and billing. Smart meters enable two-way communication between the meter and the central system via an AMI network.

When a smart meter is installed at a customer location, global positioning system (GPS) coordinates are programmed into the meter. The GPS coordinates of the smart meter can be used to provide location awareness for applications executing in the meter, and by the head-end system of the utility provider to validate the location of the meter, build grid maps, etc. Conventional smart meter installation procedures require the installer to determine the GPS coordinates using a GPS device and then program the GPS coordinates into the meter using a computer or other dedicated equipment for communicating with the meter. The different pieces of equipment necessary to program the GPS coordinates into the smart meter complicates the installation process.

SUMMARY

Systems and methods for programming GPS coordinates of electric meters using an application executing on a smart device are provided.

According to various aspects of the present disclosure there is provided a method. In some aspects, the method may include receiving, by a server remote from the smart meter, an image file of a photograph of the smart meter; recognizing identification information of the smart meter from the image file; extracting GPS coordinates from metadata of the received image file; transmitting the GPS coordinates and instructions to store the GPS coordinates to the smart meter identified by the identification information; and storing, by a processor of the smart meter, the GPS coordinates in a memory of the smart meter.

The method may further include performing image recognition of the received image file to recognize the identification information of the smart meter. The identification information of the smart meter may be an identification number in the form of an alphanumeric code, a barcode, or a quick response (QR) code. The GPS coordinates may be stored in a database record associated with the identification information of the smart meter.

The photograph of the smart meter may be captured by a camera on a smart device, and an application executing on the smart device may cause the image file to be transmitted to the server. The smart device may communicate with the server via the Internet or cellular service.

The method may further include, prior to transmitting the GPS coordinates and instructions, determining that the smart meter has not joined an AMI network, and delaying transmission of the GPS coordinates and instructions until the smart meter joins the AMI network.

According to various aspects of the present disclosure, there is provided a system. In some aspects, the system may include a smart device operable to execute an application, a smart meter including a processor in a memory, and a remote server operable to communicate with the smart device and the smart meter.

The remote server may be configured to receive, from an application executing on the smart device, an image file of a photograph of the smart meter, recognize identification information of the smart meter from the image file, extract GPS coordinates from the metadata of the image file, and transmit the GPS coordinates and instructions to store the GPS coordinates to the smart meter identified by the identification information. The processor of the smart meter may be configured to store the GPS coordinates in the memory of the smart meter.

The method may further include performing image recognition of the received image file to recognize the identification information of the smart meter. The identification information of the smart meter may be an identification number in the form of an alphanumeric code, a barcode, or a quick response (QR) code. The GPS coordinates may be stored in a database record associated with the identification information of the smart meter.

The photograph of the smart meter may be captured by a camera on a smart device, and an application executing on the smart device may cause the image file to be transmitted to the server. The smart device may communicate with the server via the Internet or cellular service.

The smart meter in the remote server may communicate via an AMI network. The remote server may be further configured to, prior to transmitting the GPS coordinates and instructions, determine that the smart meter has not joined an AMI network, and delay transmission of the GPS coordinates and instructions until the smart meter joins the AMI network.

According to various aspects of the present disclosure, there is provided a non-transitory computer readable medium. In some aspects, the non-transitory computer readable medium may include instructions for causing a processor to perform operations including an image file of a photograph of the smart meter; recognizing identification information of the smart meter from the image file; extracting GPS coordinates from metadata of the received image file; and transmitting the GPS coordinates and instructions to store the GPS coordinates to the smart meter identified by the identification information.

The non-transitory computer readable medium may further include instructions including performing image recognition on the received image file to recognize the identification information of the smart meter, and storing the GPS coordinates in a database record associated with the identification information of the smart meter. The identification information of the smart meter may be an identification number in the form of an alphanumeric code, a barcode, or a quick response (QR) code.

The non-transitory computer readable medium may further include instructions including, prior to transmitting the GPS coordinates and instructions, determining that the smart meter has not joined an AMI network, and delaying transmission of the GPS coordinates and instructions until the smart meter joins the AMI network.

Numerous benefits are achieved by way of the various embodiments over conventional techniques. For example, the various embodiments provide apparatuses and methods that can be used to reduce electric meter installation times and obtain electric meter information. In some embodiments, GPS coordinates for an electric meter may be obtained from geotag information embedded in metadata of a photograph of the meter installation. In other embodiments, a photograph of the electric meter may be used to identify the meter and obtain information such as past or current energy usage. These and other embodiments along with many of its advantages and features are described in more detail in conjunction with the text below and attached figures.

BRIEF DESCRIPTION OF THE DRAWINGS

Aspects and features of the various embodiments will be more apparent by describing examples with reference to the accompanying drawings, in which.

DETAILED DESCRIPTION

While certain embodiments are described, these embodiments are presented by way of example only, and are not intended to limit the scope of protection. The apparatuses, methods, and systems described herein may be embodied in a variety of other forms. Furthermore, various omissions, substitutions, and changes in the form of the example methods and systems described herein may be made without departing from the scope of protection.

Figure 1:
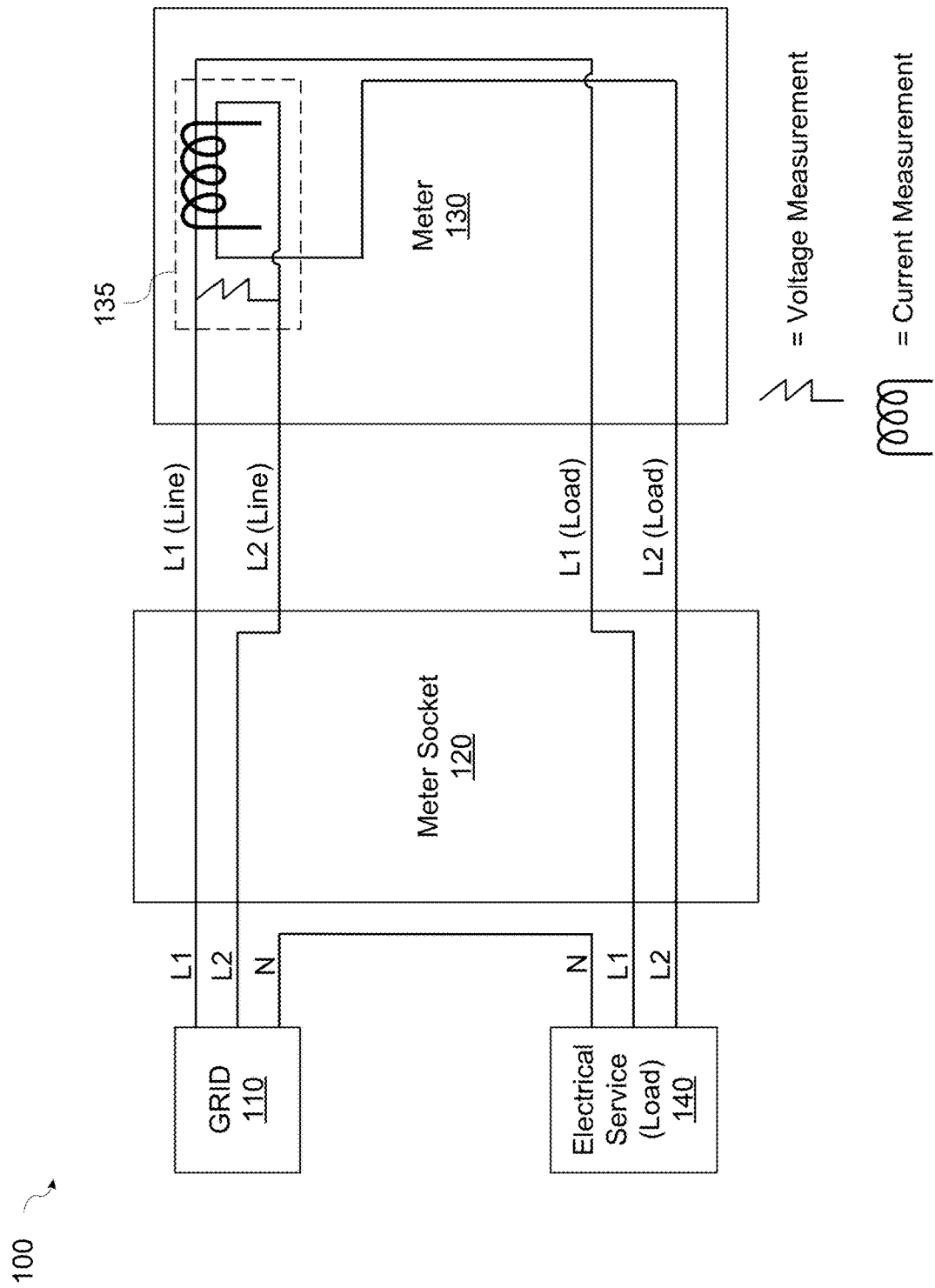
FIG. 1 is a block diagram illustrating electrical connections to an electric meter and meter socket according to some aspects of the present disclosure.

An electric meter measures electrical power consumed by a customer of an electric utility provider. The electric meter is plugged into a meter socket that is mounted in an enclosure on a building or other structure and provides a connection between the electric power delivered by the electrical utility and the customer. FIG. 1 is a block diagram illustrating electrical connections to an electric meter and meter socket according to some aspects of the present disclosure.

As illustrated in FIG. 1, power from the grid 110 (i.e., the electrical distribution grid) is supplied to the meter socket 120 via electrical wiring L1 and L2. Electrical wiring L1 and L2 may provide power from two phases of the grid. The neutral wire N, sometimes referred to as ground, is connected between the grid 110 and the electrical service 140, for example, at an electrical service panel. In some cases, power may be provided from three phases of the grid, and appropriate wiring and connections (not shown) provided.

The electrical service 140 is also connected to the meter socket 120 via corresponding electrical wiring L1 and L2. The electric meter 130 includes an insulating base having electrical connectors to provide electrical connections to the meter socket 120. The meter socket 120 includes an insulating base having electrical connectors to provide electrical connections to the electric meter 130 when the electric meter 130 is plugged into the meter socket 120. An electrical connection between the grid 110 and the electrical service 140 is formed through the electric meter 130 when the electric meter 130 is plugged into the meter socket 120. Within the electric meter 130, voltage and current provided by the grid 110 to the electrical service 140 is measured, or metered, by measuring devices 135, for example, voltage transformers and current transformers. Power delivered to the electrical service 140 may be calculated based on the voltage and current measurements.

In some installations, power may be provided from only one phase of the grid (e.g., one phase, 120V service) on a single wire. In some installations, power may be provided as a "split phase" 240V service from a center tapped transformer supplied by only one phase of the grid. Further, the electric meter may not always be placed between the utility and end-consumer. For example, in high current applications, the consumer may be directly connected to the utility with the electric meter connected to the service via current transformers.

Advanced Metering Infrastructure (AMI) electric meters, also known as smart meters, are updated, digital versions of the traditional electrical meter. A smart meter records consumption of electric energy and communicates the information to the utility provider for monitoring and billing. Smart meters enable two-way communication between the meter and the central system via the AMI network.

Advanced metering infrastructure (AMI) is an integrated system of smart meters, communications networks, and data management systems that enables two-way communication between utilities and customers. The system provides a number of important functions, such as the ability to automatically and remotely measure electricity use, connect and disconnect service, detect tampering, identify and isolate outages, and monitor power line voltage.

Figure 2:
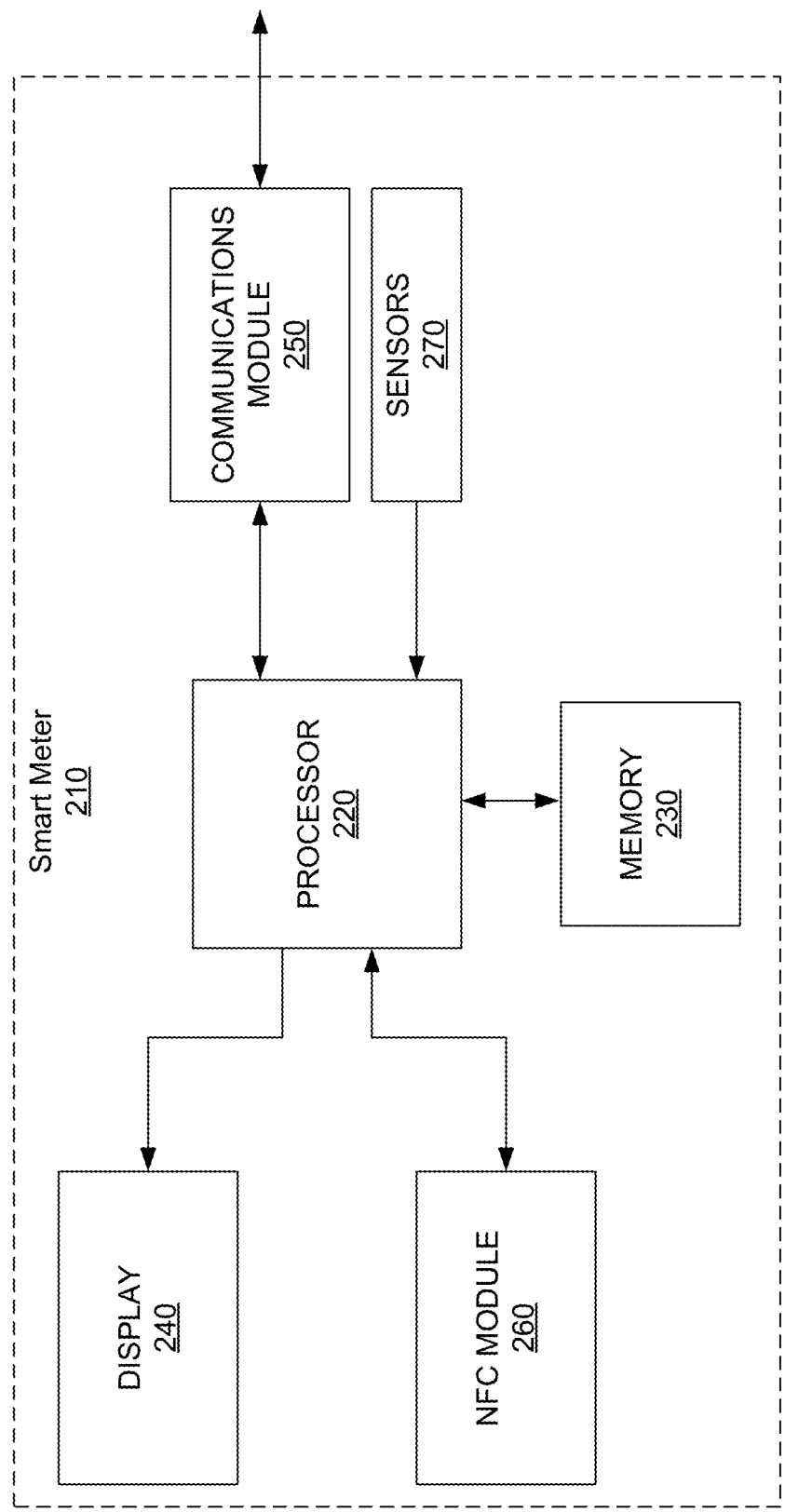
FIG. 2 is a simplified block diagram of a smart meter 210 according to some aspects of the present disclosure.

FIG. 2 is a simplified block diagram of a smart meter 210 according to some aspects of the present disclosure. The smart meter 210 may include a processor 220, a memory 230, a display panel 240, a communications module 250, a near field communication (NFC) module 260, and various sensors 270.

The processor 220 may be a general purpose processor, a digital signal processor (DSP), an application specific integrated circuit (ASIC), a field programmable gate array (FPGA) or other programmable logic device. The processor 220 may be in electrical communication with the memory 230, the display panel 240, the communications module 250, the NFC module 260 and the sensors 270, and may control overall operation of the smart meter 210. The processor 220 may receive data generated by various sensors 270 of the smart meter 210 including, but not limited to, energy use, voltage, current, etc., and may perform operations on, or processing of, the data. The processor 220 may communicate with the display panel 240 to display various operational parameters (e.g., energy usage), diagnostic data (e.g., error conditions), or other smart meter information (e.g., GPS coordinates).

The memory 230 may be a storage device such as a solid state storage device or other storage device, and may be a combination of volatile and non-volatile storage or memory. In some implementations, portions of the memory may be included in the processor 220. The memory 230 may be configured to store instructions executable by the processor 220, as well as data generated by the various sensors 270 of the smart meter 210, and other applications executable by the processor 220.

The display panel 240 may be an electronic display, for example, a liquid crystal display (LCD) or light-emitting diode (LED) or other display. The display panel 240 may display various parameters measured by the smart meter (e.g., kilowatt-hours, voltage, etc.) as well as diagnostic information regarding the state of the meter (e.g., temperature) and other information such as GPS coordinates.

The communications module 250 may be a wired or wireless transceiver operable to communicate via various wired or wireless protocols as known in the field for example, but not limited to the AMI protocol. The communications module 250 may enable the smart meter 210 to communicate with other smart meters in a network (e.g., an AMI network) and with the utility provider controlling the network. The communications module 250 may transmit data and alarm signals to the utility provider and receive any of updated program instructions, firmware updates, updates to other settings, or other communications.

The NFC module 260 may provide near-field communication between the smart meter 210 and an NFC enabled device, such as a smart phone or other smart device, when the device is brought into proximity with the smart meter 210. In some cases the NFC module 260 may be a passive device, such as an radio frequency identification (RFID) tag, capable of storing information related to the smart meter 210 that can be read by the NFC enabled device. In some cases the NFC module 260 may be an active device capable of peer-to-peer communication with other NFC enabled devices.

A smart device may be a mobile computing device having GPS capability, a camera, mobile communication capability, (e.g., cellular, Wifi, Bluetooth, etc.) and capability running downloaded applications. A smart device may be, for example, but not limited to, a smart phone, tablet, laptop, etc.

The sensors 270 may include, but are not limited to, voltage sensors, current sensors, accelerometers, tilt switches, temperature sensors, and other sensors configured to monitor electrical and physical characteristics of the smart meter.

Figure 3:
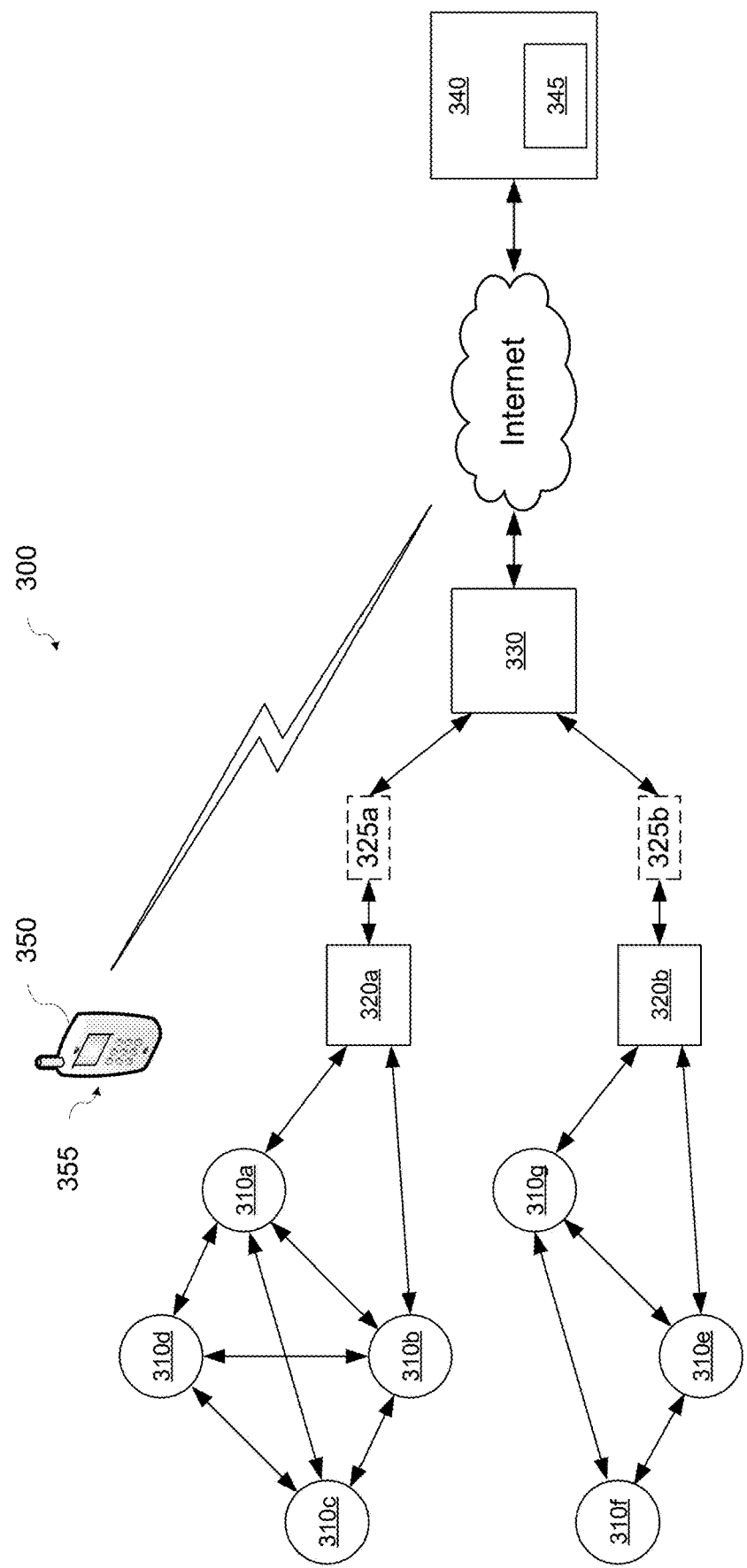
FIG. 3 is a diagram a simplified block diagram of an AMI network according to some aspects of the present disclosure.

FIG. 3 is a diagram a simplified block diagram of an AMI network 300 according to some aspects of the present disclosure. Referring to FIG. 3, smart meters 310a-310d may be in wireless communication with each other and with router 320a. The router 320a may be in wireless or wired communication with a gateway 330. Similarly, smart meters 310e-310g may be in wireless communication with each other and with router 320b. The router 320b may be in wireless or wired communication with a gateway 330. The gateway 330 may be in communication with the head-end system 340 via the Internet or another network. The head-end system 340 may include a server 345 to communicate with the gateway 330. In some cases, the server 345 may reside in the cloud. The server 345 may include one or more processors (not shown). The processors may be general purpose processors, digital signal processors (DSP), an application specific integrated circuits (ASIC), or other processors operable for a server. The one or more processors may be in electrical communication with a memory (not shown).

The head-end system 340 may store a database containing information about the smart meters 310a-310g, for example, but not limited to, physical locations of the smart meters (e.g., customer Street addresses), GPS coordinates, serial numbers, network addresses, etc., and may be responsible for communicating with the smart meters 310a-310g and other utility assets over the AMI network 300. The head-end system 340 may listen to the AMI network 300 for data transmitted from the smart meters 310a-310g as well as send commands (e.g., open a service switch) and data (e.g., GPS coordinates) to the smart meters 310a-310g.

GPS coordinates of a smart meter may be used by utility providers for several purposes, for example, but not limited to, identifying the physical location of the meter, tamper detection, power quality determination, etc. The GPS coordinates may be obtained during smart meter installation at a customer location. According to some aspects of the present disclosure, apparatuses and methods for obtaining and programming GPS coordinates for a smart meter are provided.

When a smart meter is installed in a powered socket at a customer location, the installer may photograph the installed smart meter using a camera included in a smart device 350. The photograph of the smart meter may be geotagged by the smart device 350 with information including latitude, longitude, and altitude data of the smart meter location embedded in the metadata of an image file for the photograph. Photographing the installed smart meter can verify the installation (e.g., that the socket is powered) and prevent inaccurate GPS coordinates from being provided by photographing a group of smart meters prior to installation. An application 355 executing on the smart device may cause the image file to be transmitted. The smart device 350 may transmit the image file of the smart meter, for example, via the Internet or cellular service, to the head-end system or other remote computer system of the utility provider for analysis. In some implementations, the remote computer system may be an edge computing device 325a, 325b located within the network of smart meters between the smart meters and the gateway. In some implementations, the edge computing device may be included in addition to the remote computer system.

A server of the head-end system (e.g., the server 345 of the head-end system 340), or another server at another remote computer system in communication with the head-end system, may receive the image file of the installed smart meter. An application executing on the server may extract the GPS coordinates from the image file. In some implementations, the application executing on the server may analyze the image file, for example, using image recognition, to determine if the socket in which the smart meter is installed is powered. A determination whether the socket is powered may be made, for example, by recognizing alphanumeric characters on a display on the face of the smart meter. In cases where the smart meter does not include a display, another visible power indicator such as an illuminated pilot light may be recognized from the photograph. In some implementations, the image recognition may be performed by the application 355 executing on the smart device, and the recognized information (e.g., serial number, power indication, GPS coordinates, etc.) as well as the image file may be transmitted to the server.

Additional information may be included on the face of the smart meter. For example, any or all smart meter identification, such as a serial number or other identification number, a network identification number, a network address, etc., may be visible (e.g., on a sticker or directly printed) on the face of the smart meter as alphanumeric characters or bar codes or quick response (QR) codes or any combination of them. The additional information may be recognized from the image file of the photograph by the server using image recognition.

The GPS coordinates and additional smart meter information may be stored in a database of the head-end system or other remote computer system in a record corresponding to the identified smart meter. The head-end system or other remote computer system may transmit the GPS coordinates and instructions to store the GPS coordinates to the smart meter corresponding to the recognized identification number (e.g., serial number) at the recognized network address. The smart meter may receive and store the GPS coordinates in a non-volatile memory.

In some implementations, an application executing on the edge computing device may process the image file or data or both, and transmit the GPS coordinates and instructions to store the GPS coordinates to the smart meter corresponding to the recognized identification number at the recognized network address.

While an AMI network is described with respect to FIG. 3, it should be appreciated that other types of communication networks (e.g., cellular, Wifi, etc.) may be used without departing from the scope of the present disclosure.

Figure 4:
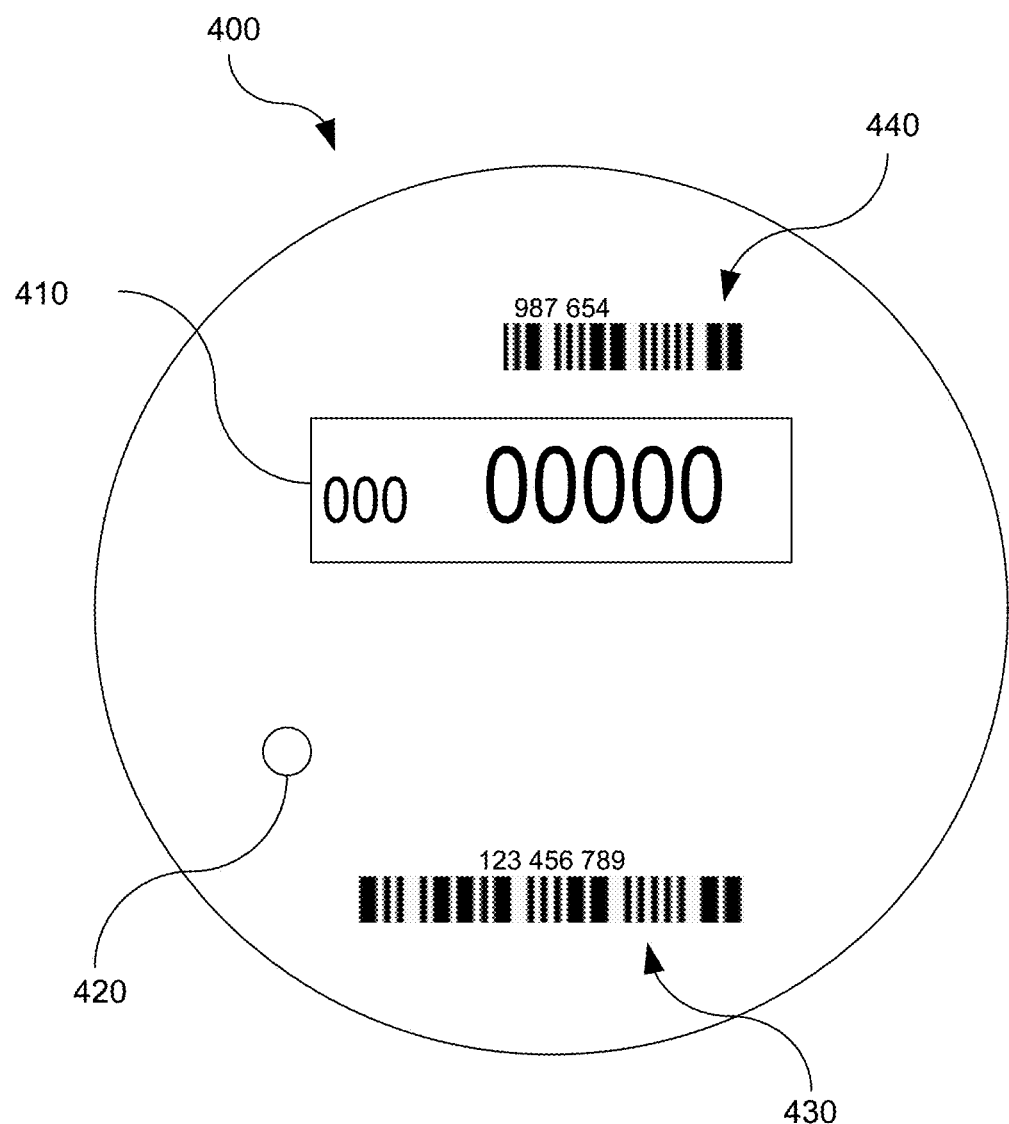
FIG. 4 is a diagram illustrating an example of a smart meter face according to some aspects of the present disclosure.

FIG. 4 is a diagram illustrating an example of a smart meter face 400 according to some aspects of the present disclosure. Referring to FIG. 4, the smart meter face 400 may include a display panel 410, a power indicator 420, and identifying information 430, 440 for the smart meter. The smart meter face 400 may include additional features without departing from the scope of the present disclosure.

The display panel 410 may be an electronic display, for example, a liquid crystal display (LCD) or light-emitting diode (LED) or other display. The display panel 410 may display various parameters measured by the smart meter (e.g., kilowatt-hours, voltage, etc.) as well as diagnostic information regarding the state of the meter (e.g., temperature) and other information such as GPS coordinates. A power indicator 420, for example, an LED, may be included on the smart meter face 400 to indicate that the smart meter is powered from the socket (e.g., the socket is live). While an indication that the smart meter is receiving power can be determined based on alphanumeric characters visible on the display panel 410, some embodiments may not include a display panel, and the power indicator 420 may provide the indication that the smart meter is receiving power from the socket.

The smart meter face 400 may further include a smart meter identification number 430, for example, a serial number or other identification number of the smart meter, and a network ID 440, for example, an AMI network address or other network identifier. The identification number 430 and the network ID 440 may be a barcode or a QR code and may also include alphanumeric characters. The identification number 430 and the network ID 440 may be recognizable by the image recognition application from the image file of the smart meter face.

Figure 5:
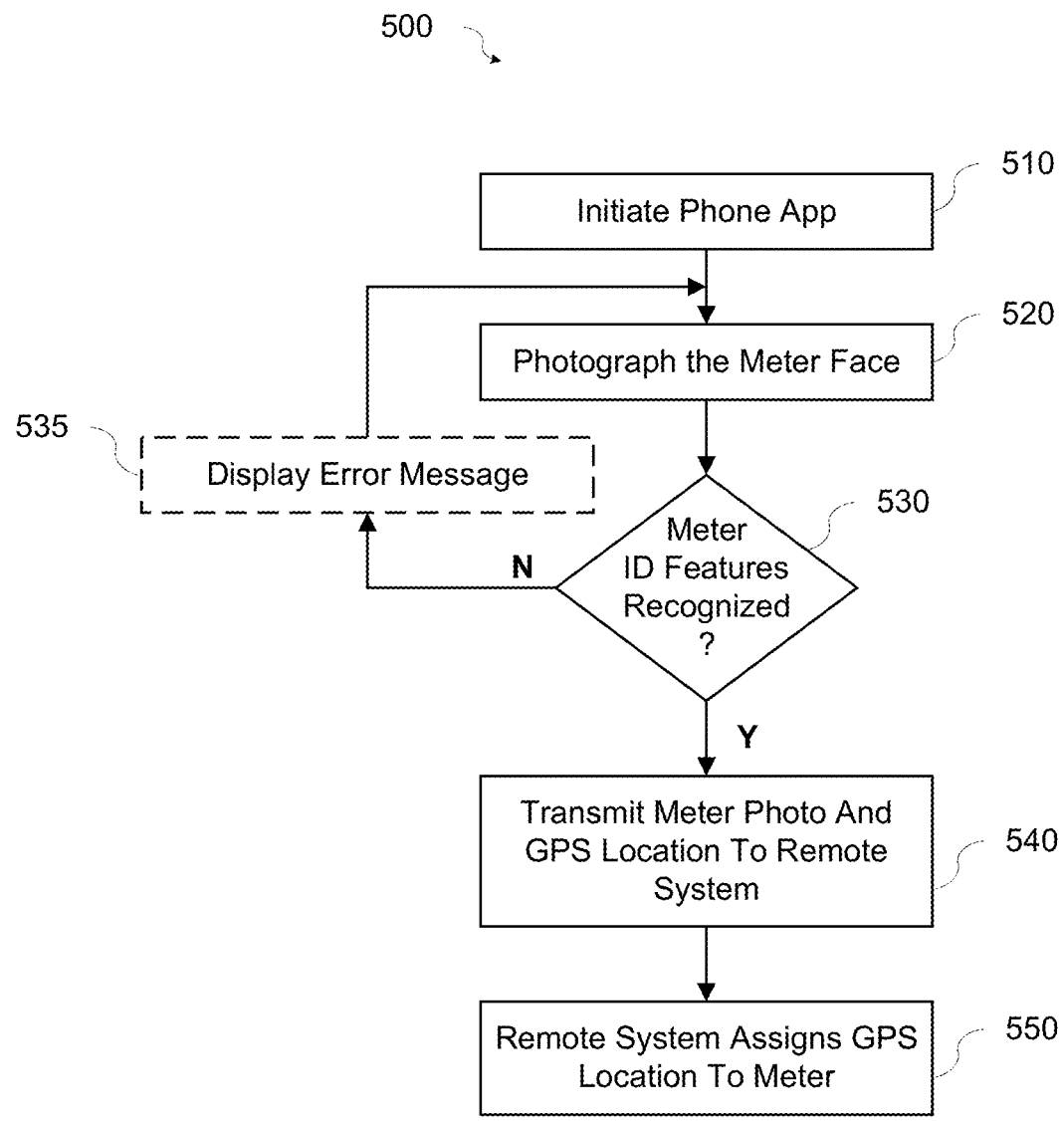
FIG. 5 is a flowchart illustrating an example of a method for determining GPS coordinates for a smart meter using an application executing on a smart device according to aspects of the present disclosure.

FIG. 5 is a flowchart illustrating an example of a method 500 for determining GPS coordinates for a smart meter using an application executing on a smart device according to aspects of the present disclosure. At block 510, a user may initiate the application (e.g., the application 355) on the smart device. After a smart meter is installed in a powered socket at a customer location, the user may select the application on the smart device.

At block 520, the user may photograph the front face of the installed smart meter. The user may center the smart meter face in the viewfinder of the smart device such that the features of the smart meter face are visible in the photograph. The smart device may geotag the image file for the photograph with the GPS coordinates of the location where the photograph was taken. The GPS coordinates may be included in the metadata of the image file for the photograph.

At block 530, it may be determined whether the identification features of the smart meter are recognized. In some implementations, the smart device application may perform image recognition to recognize the smart meter identification information, for example, but not limited to, the smart meter serial number and network ID. In some implementations, the user may review the photograph to determine whether the smart meter identification information is recognizable. In response to determining that the smart meter identification information is not recognizable (530-N), at block 535, the smart device application may optionally cause an error message to be displayed indicating that the information could not be recognized, and the method may continue at block 520 to retake the photograph.

In response to determining that the smart meter identification information is recognizable (530-Y), at block 540, the smart device application may cause the image file of the photograph of the smart meter face, including the geotag information in the metadata, to be transmitted to the head-end system or other remote computer system. In some implementations, the smart device application may perform image recognition to recognize the smart meter identification information and extract the GPS coordinates from the metadata of the image file. In such cases, the smart device application may cause the smart meter identification information and extracted GPS coordinates to be transmitted to the head-end system or other remote computer system together with the image file of the smart meter face. In some embodiments, the smart device application may transmit the image file of the smart meter face to the head-end system or other remote computer system. In such cases, the server at the head-end system or other remote computer system may perform the image recognition to obtain the smart meter identification information and extract the GPS coordinates from the metadata of the image file. The GPS coordinates and additional smart meter information may be stored in a database of the head-end system or other remote computer system in a record corresponding to the identified smart meter.

At block 550, the head-end system or other remote computer system may transmit the GPS coordinates to the smart meter corresponding to the recognized identification number (e.g., serial number) at the recognized network address. For example, the head-end system or other remote computer system may transmit the GPS coordinates and instructions to store the GPS coordinates over the AMI network to the smart meter. The smart meter may receive and store the GPS coordinates. For example, a processor of the smart meter may store the GPS coordinates in a nonvolatile memory.

It should be appreciated that the specific operations illustrated in FIG. 5 provide a particular method for determining GPS coordinates for a smart meter according to an embodiment of the present invention. Other sequences of operations may also be performed according to alternative embodiments. For example, alternative embodiments of the present invention may perform the operations outlined above in a different order. Moreover, the individual operations illustrated in FIG. 5 may include multiple sub-operations that may be performed in various sequences as appropriate to the individual operation. Furthermore, additional operations may be added or removed depending on the particular applications. One of ordinary skill in the art would recognize many variations, modifications, and alternatives.

Figure 6:
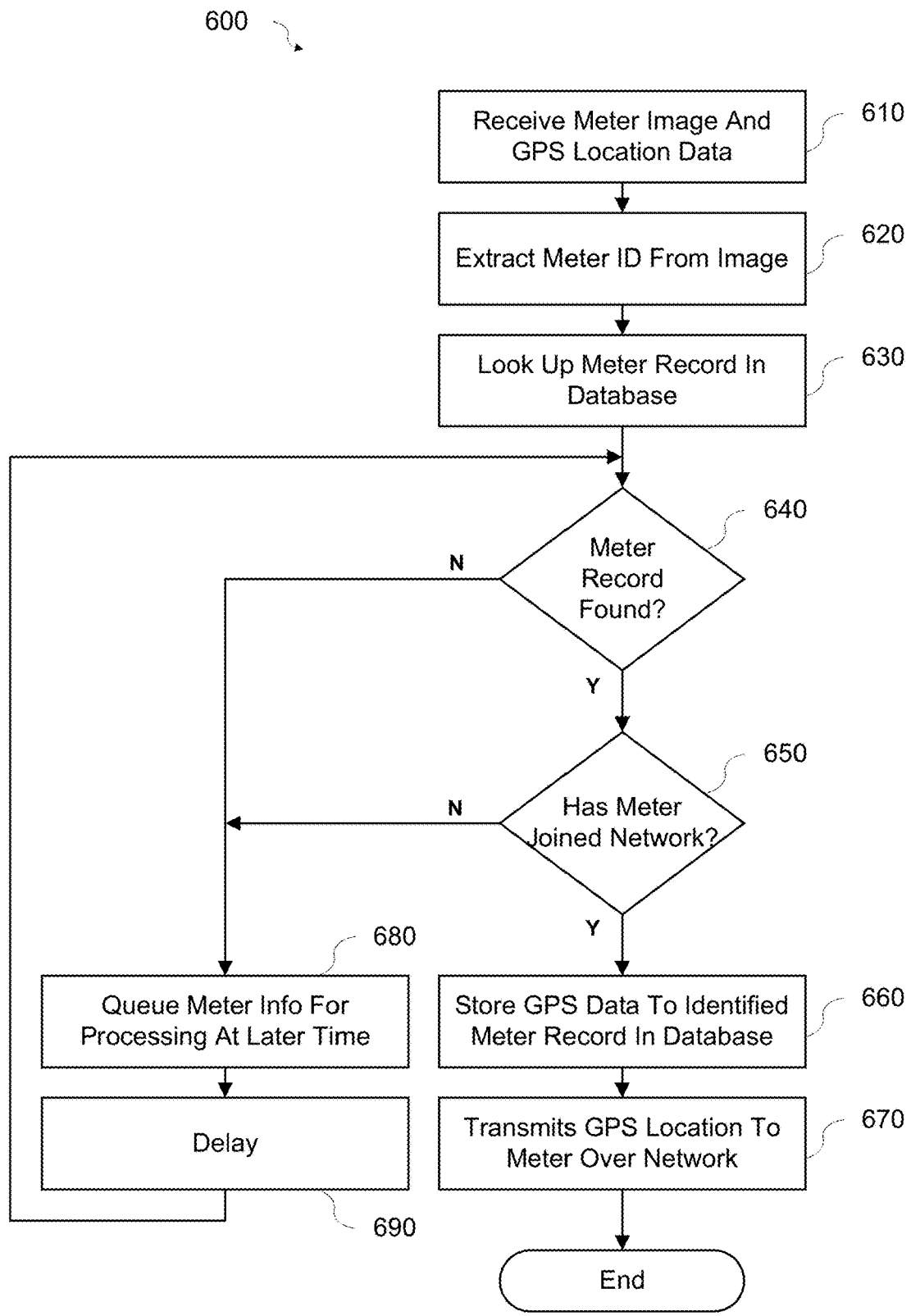
FIG. 6 is a flowchart illustrating an example of a method for programming GPS coordinates for a smart meter from a remote computer system according to aspects of the present disclosure.

FIG. 6 is a flowchart illustrating an example of a method 600 for programming GPS coordinates for a smart meter from a remote computer system according to aspects of the present disclosure. Referring to FIG. 6, at block 610, a photograph of an installed smart meter and GPS location data for the smart meter may be received. The server of the head-end system or other remote computer system may receive the photograph of the installed smart meter as an image file. The image file may have been created by an application (e.g., the application 355) executing on a smart device from a photograph of the installed smart meter captured by a camera of the smart device. The GPS location data (e.g., longitude, latitude, and altitude coordinates) may be embedded in the metadata of the image file. In some implementations, the GPS location data may have been extracted by the application executing on a smart device and received by the server in addition to the image file.

At block 620, the smart meter identification information may be extracted from the image file. The server may perform image recognition on the received image file to recognize the smart meter identification information such as a serial number, network ID, etc. In some implementations, the smart meter identification information may have been extracted from the image file, for example by the application executing on the smart device, and transmitted to the server in addition to the image file.

At block 630, a database may be searched for a record associated with the smart meter identification information. The head-end system or other remote computer system may include a database of information associated with each smart meter. For example, records may be associated with the serial numbers or other identification numbers of the smart meters. The server of the head-end system or other remote computer system may search the database to determine whether a record associated with the serial number or other identification number of the smart meter recognized from the received image file exists.

At block 640, it may be determined whether a record for the smart meter was found. The server of the head-end system or other remote computer system may determine whether or not the database contains a record associated with the serial number or other identification number of the smart meter recognized from the image file.

In response to determining that a record for the smart meter was not found (640-N), at block 680, the information associated with the serial number or other identification number of the smart meter may be stored in a queue for subsequent processing. For example, the server may store the information in a memory location for later retrieval and entry into the database.

At block 690, the process may delay for a period of time. For example, the server may associate a timer with the information stored for later retrieval. In some cases, entry of a record associated with a smart meter into the database may be delayed. For example, records may be entered into the database on a predetermined schedule that may not coincide with smart meter installation. The delay period may be variable, for example, minutes, hours, etc. After expiration of delay period set by the timer, the process may continue at block 640 to determine whether a record for the smart meter was found.

In response to determining that a record for the smart meter was found (640-Y), at block 650, it may be determined whether the smart meter has joined the network (e.g., an AMI network). The server of the head-end system or other remote computer system may determine whether communication with the smart meter over the network has been established.

In response to determining that the smart meter has not joined the network (650-N), at block 680, the information associated with the serial number or other identification number of the smart meter may be stored in a queue for subsequent processing. For example, the server may store the information in a memory location for later retrieval and entry into the database.

At block 690, the process may delay for a period of time. For example, the server may associate a timer with the information stored for later retrieval. In some cases, communication between the server of the head-end or remote computer system and a newly installed smart meter may be delayed due to the transmission characteristics of the mesh network. The delay period may be variable, for example, minutes, hours, etc. After the delay period, the process may return to block 640.

In response to determining that the smart meter has joined the network (650-Y), at block 660, the GPS coordinates may be stored in the database. The server of the head-end system or other remote computer system may store the GPS coordinates of the smart meter in the database in the record associated with the identification information of the smart meter.

At block 670, the server of the head-end system or other remote computer system may transmit the GPS location data to the smart meter. In order for the smart meter to know its location, the server of the head-end system or other remote computer system may transmit the GPS location data (e.g., GPS coordinates) and instructions to store the GPS location data to the smart meter over the network. The smart meter may store the GPS coordinates, for example, in a nonvolatile memory. The smart meter may then use the GPS coordinates for applications running in the meter and for subsequent communications with neighboring smart meters as well as with the head-end system or other remote computer system.

It should be appreciated that the specific operations illustrated in FIG. 6 provide a particular method for programming GPS coordinates for a smart meter from a remote computer system according to an embodiment of the present invention. Other sequences of operations may also be performed according to alternative embodiments. For example, alternative embodiments of the present invention may perform the operations outlined above in a different order. Moreover, the individual operations illustrated in FIG. 6 may include multiple sub-operations that may be performed in various sequences as appropriate to the individual operation. Furthermore, additional operations may be added or removed depending on the particular applications. One of ordinary skill in the art would recognize many variations, modifications, and alternatives.

The methods 500 and 600, respectively, may be embodied on a non-transitory computer readable medium, for example, but not limited to, a memory or other non-transitory computer readable medium known to those of skill in the art, having stored therein a program including computer executable instructions for making a processor, computer, or other programmable device execute the operations of the methods.

The smart meter may receive and store in its memory GPS coordinates from neighboring smart meters, and may transmit its own GPS coordinates to the neighboring smart meters. In cases where the smart meter is relocated, either by the utility provider or by a malicious actor, the smart meter may compare the GPS coordinates received from its new neighboring smart meters with the stored GPS coordinates of the former neighboring smart meters to determine that its location has changed. The smart meter may notify the server of the head-end system or other remote computer system that its location has changed. The utility provider may then take appropriate action with regard to the relocated smart meter.

According to some aspects of the present disclosure, a user may use an application executing on a smart device to obtain information associated with the smart meter. The information may include, for example, but not limited to, energy usage, error conditions, location data, billing data, energy rate data, etc.

In one embodiment, a user may take a photograph of the smart meter face using the camera of the smart device. The application executing on the smart device may perform image recognition on the image file of the photograph to recognize smart meter identification information. The identification information may include a smart meter identification number, for example, a serial number or other identification number of the smart meter, a network ID, for example, an AMI network address or other network identifier. The identification number and the network ID may be a barcode or a QR code and may also include alphanumeric characters. In some cases, the identification information may be displayed on a display panel (e.g., the display panel 410). In some cases, the identification information may be printed on the face of the meter, either directly, or on adhesive labels.

The smart device application may cause the smart meter identification information to be transmitted to the server of the head-end system or other remote computer system with a request for information associated with the smart meter. In some implementations, the smart device application may not perform image recognition, and the image file of the photograph may be transmitted to the server of the head-end system or the remote computer system. For example, the smart device may communicate with the server of the head-end system or other remote computer system via the Internet or cellular service. In cases where the image file is transmitted, the server may perform the image recognition to obtain the smart meter identification information. The server may access the database for information associated with the received smart meter identification information. The information associated with the smart meter may include, for example, but is not limited to, account information (e.g., account number, billing dates, billing amounts, projected rate changes, etc.), smart meter operational information (e.g., energy usage, phase voltages, current, power factor, etc.), as well as other smart meter information (e.g., GPS coordinates, temperature, error indications or codes, etc.). The server may transmit the requested data to the application executing on the smart device. The smart device application may receive the data and cause the data to be presented on the display of the smart device.

Figure 7:
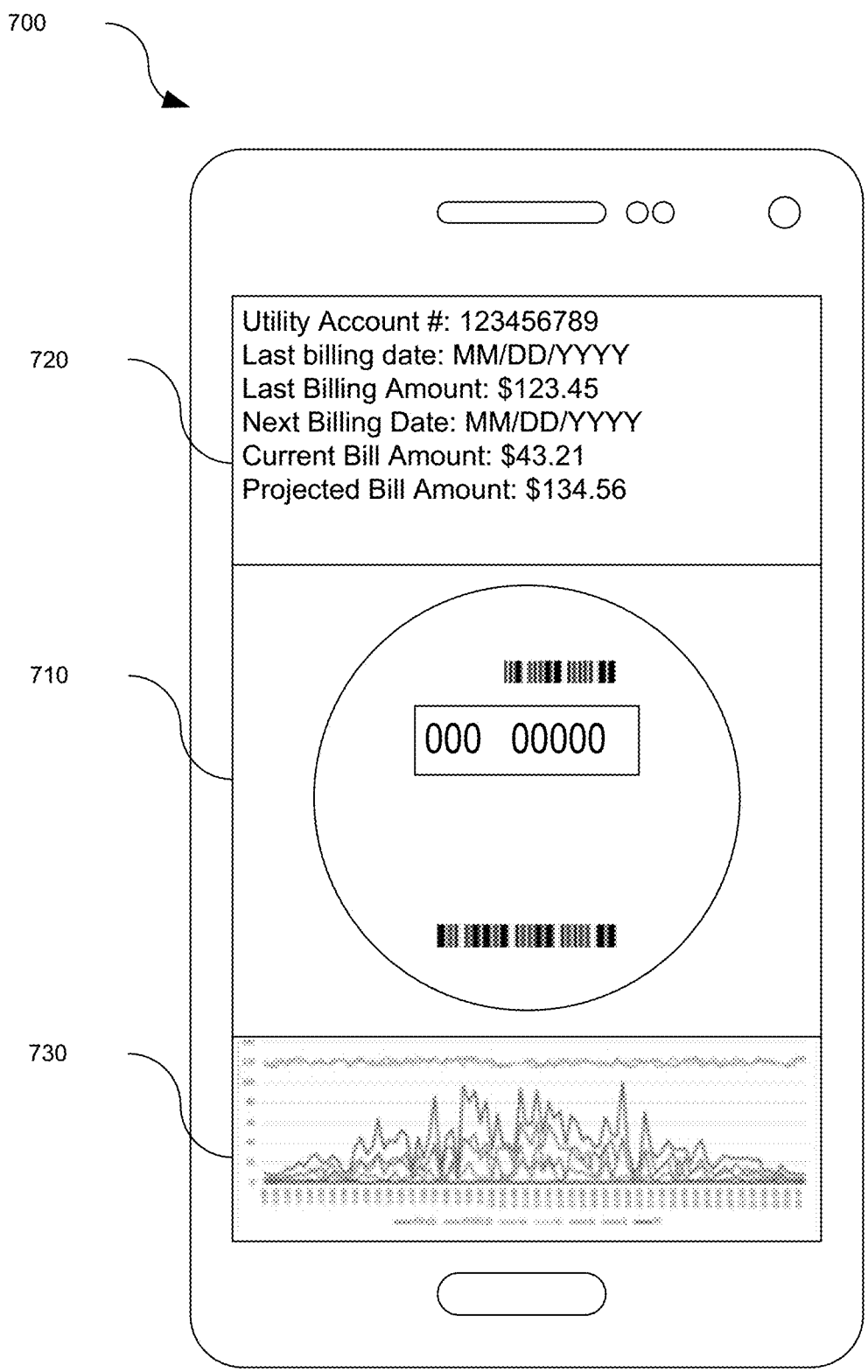
FIG. 7 illustrates an example of a smart device 700 with received information related to the smart meter presented on the display according to some aspects of the present disclosure.
Figure 8:
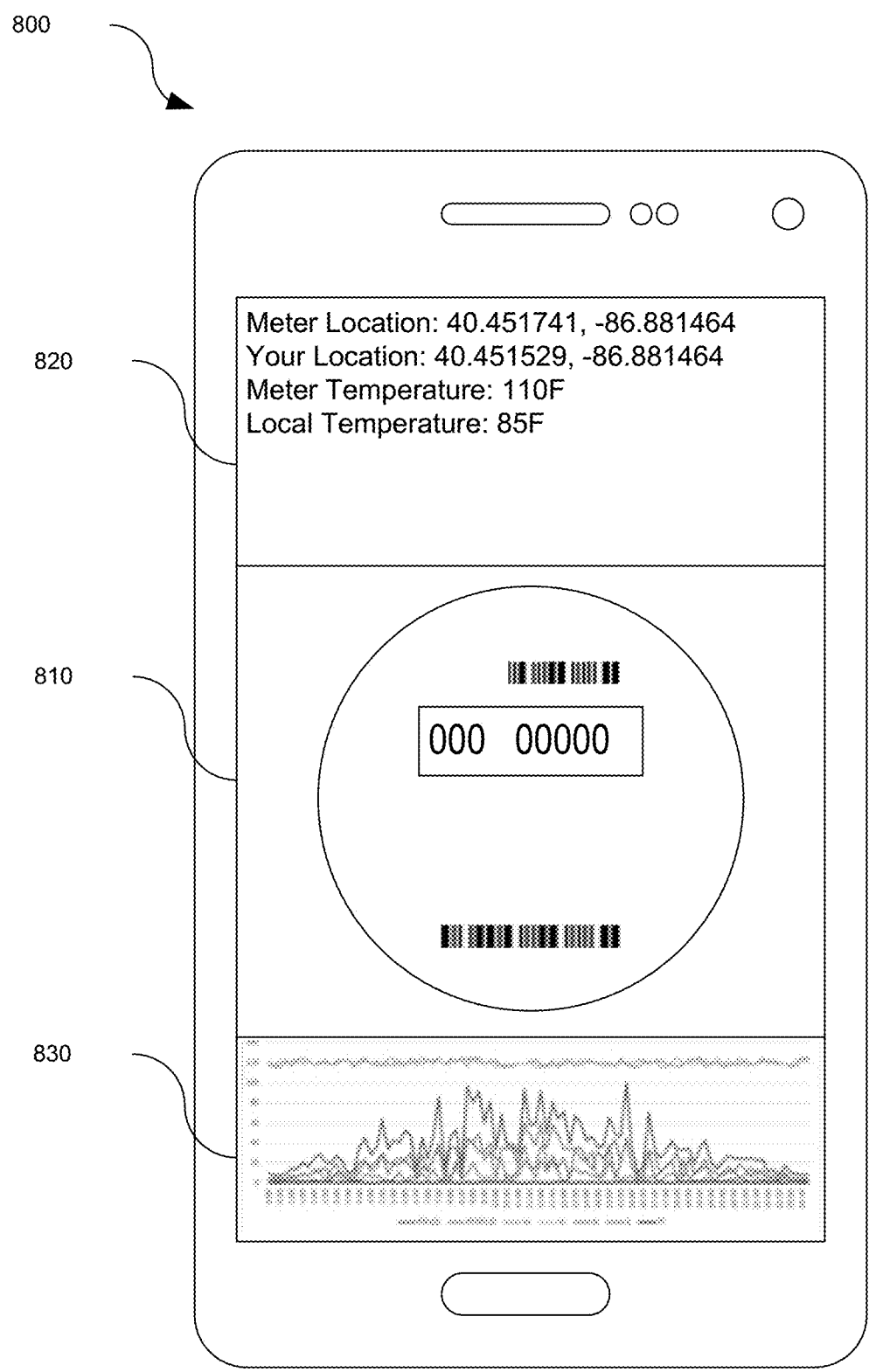
FIG. 8 illustrates another example of a smart device 800 with received information related to the smart meter presented on the display according to some aspects of the present disclosure.

FIG. 7 illustrates an example of a smart device 700 with received information associated with the smart meter presented on the display according to some aspects of the present disclosure. Referring to FIG. 7, a photograph 710 of the face of the smart meter may be displayed together with account information 720 and operational information 730 presented graphically. FIG. 8 illustrates another example of a smart device 800 with received information related to the smart meter presented on the display according to some aspects of the present disclosure. FIG. 8 again shows a photograph 810 of the face of the smart meter, location and temperature information 820, and a graph 830 of the operational information.

Figure 9:
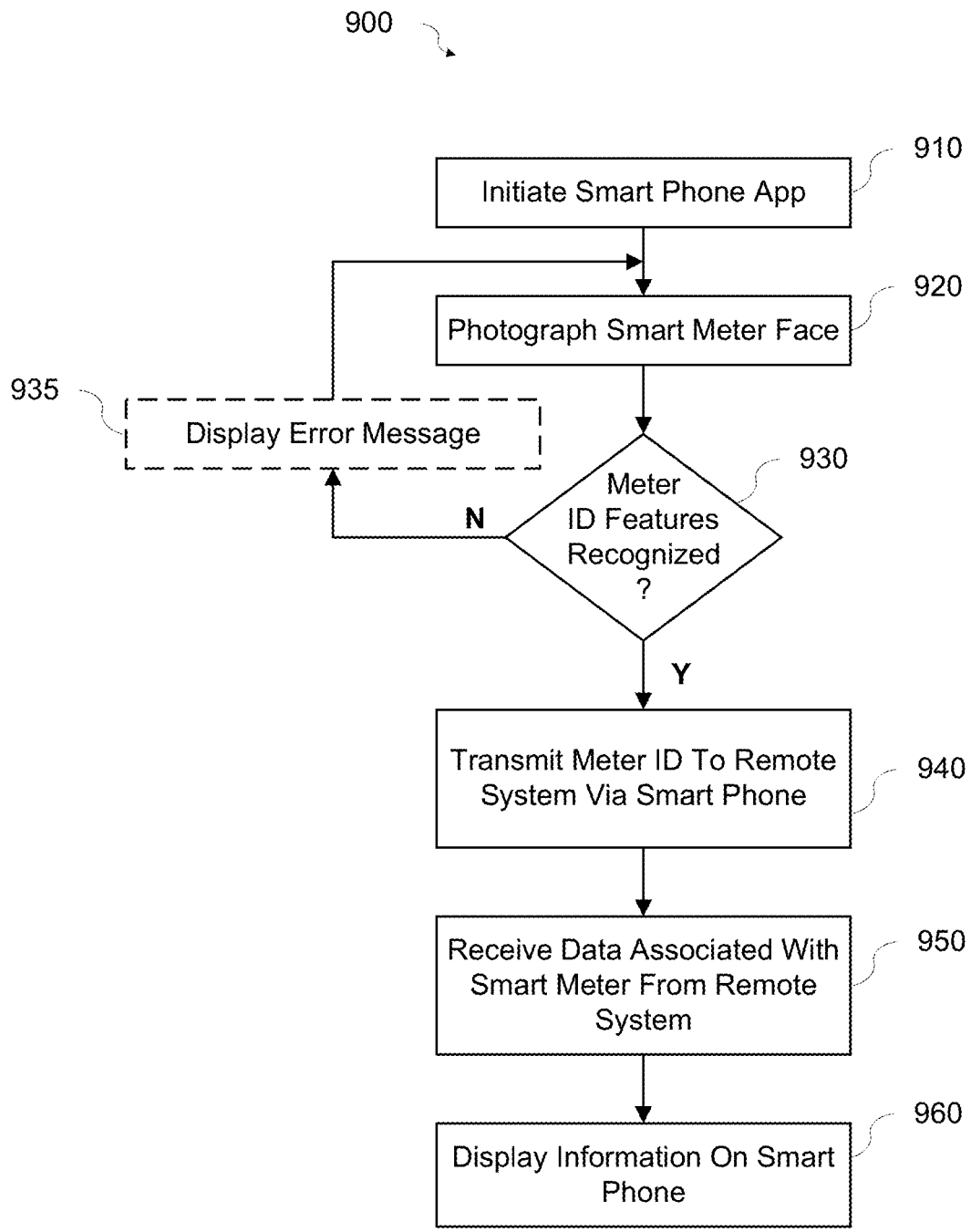
FIG. 9 is a flowchart illustrating an example of a method 900 for obtaining information associated with a smart meter using an application executing on a smart device according to some aspects of the present disclosure.

FIG. 9 is a flowchart illustrating an example of a method 900 for obtaining information associated with a smart meter using an application executing on a smart device according to some aspects of the present disclosure. Referring to FIG. 9, at operation 910, a user may initiate the application (e.g., the application 355) on the smart device.

At block 920, the user may photograph the front face of the installed smart meter. The user may center the smart meter face in the viewfinder of the smart device such that the features of the smart meter face are visible in the photograph.

At block 930, it may be determined whether the identification features of the smart meter are recognized. In some implementations, the smart device application may perform image recognition to recognize the smart meter identification information, for example, but not limited to, the smart meter serial number and network ID. In some implementations, the user may review the photograph to determine whether the smart meter identification information is recognizable. In response to determining that the smart meter identification information is not recognizable (930-N), at block 935, the smart device application may optionally cause an error message to be displayed indicating that the information could not be recognized, should the method may continue at block 920 to retake the photograph.

In response to determining that the smart meter identification information is recognizable (930-Y), at block 940, the smart device application may perform image recognition to recognize the smart meter identification information, for example, but not limited to, the smart meter serial number and network ID, and may cause the smart meter identification information to be transmitted to the head-end system or other remote computer system. In some implementations, the smart device application may not perform image recognition and may cause the image file of the photograph of the smart meter face to be transmitted to the head-end system or other remote computer system. In such cases, the server at the head-end system or other remote computer system may perform the image recognition to obtain the smart meter identification information.

The server of the head-end system or other remote computer system may access a database for information associated with the identified smart meter, and may transmit the information to the smart device application. For example, the information may be transmitted from the server of the head-end system or other remote computer system to the smart device via the Internet or cellular service. At block 950, the smart device application may receive the information transmitted by the server.

At block 960, the smart device application may cause the information received from the server to be presented on a display of the smart device. For example, information such as that shown in FIGS. 7 and 8 may be presented on the smart device display. While FIGS. 7 and 8 illustrate examples of displayed information and formats of information display, other information may be displayed and other display formats may be used without departing from the scope of the present disclosure.

It should be appreciated that the specific operations illustrated in FIG. 9 provide a particular method for obtaining information associated with a smart meter according to an embodiment of the present invention. Other sequences of operations may also be performed according to alternative embodiments. For example, alternative embodiments of the present invention may perform the operations outlined above in a different order. Moreover, the individual operations illustrated in FIG. 9 may include multiple sub-operations that may be performed in various sequences as appropriate to the individual operation. Furthermore, additional operations may be added or removed depending on the particular applications. One of ordinary skill in the art would recognize many variations, modifications, and alternatives.

In another embodiment, the application executing on the smart device may enable the smart device to communicate directly with the smart meter to obtain information stored on the smart meter, for example, in the memory of the smart meter. The application may enable the smart device to communicate with the smart meter, for example, via the communications module using Wifi or another wireless communication technology or protocol, or via the NFC module using radiofrequency identification (RFID) or another NFC communication technology or protocol.

After establishing communication with the smart meter, the smart device application may cause the smart device to request information from the smart meter. The information provided by the smart meter may include operational information (e.g., energy usage, phase voltages, current, power factor, etc.), as well as other smart meter information (e.g., GPS coordinates, temperature, error indications or codes, etc.) stored locally, for example, in the memory of the smart meter. The smart device may receive the information transmitted by the smart meter, and the smart device application may cause the information to be presented on the display of the smart device, for example, as shown in FIG. 8.

Figure 10:
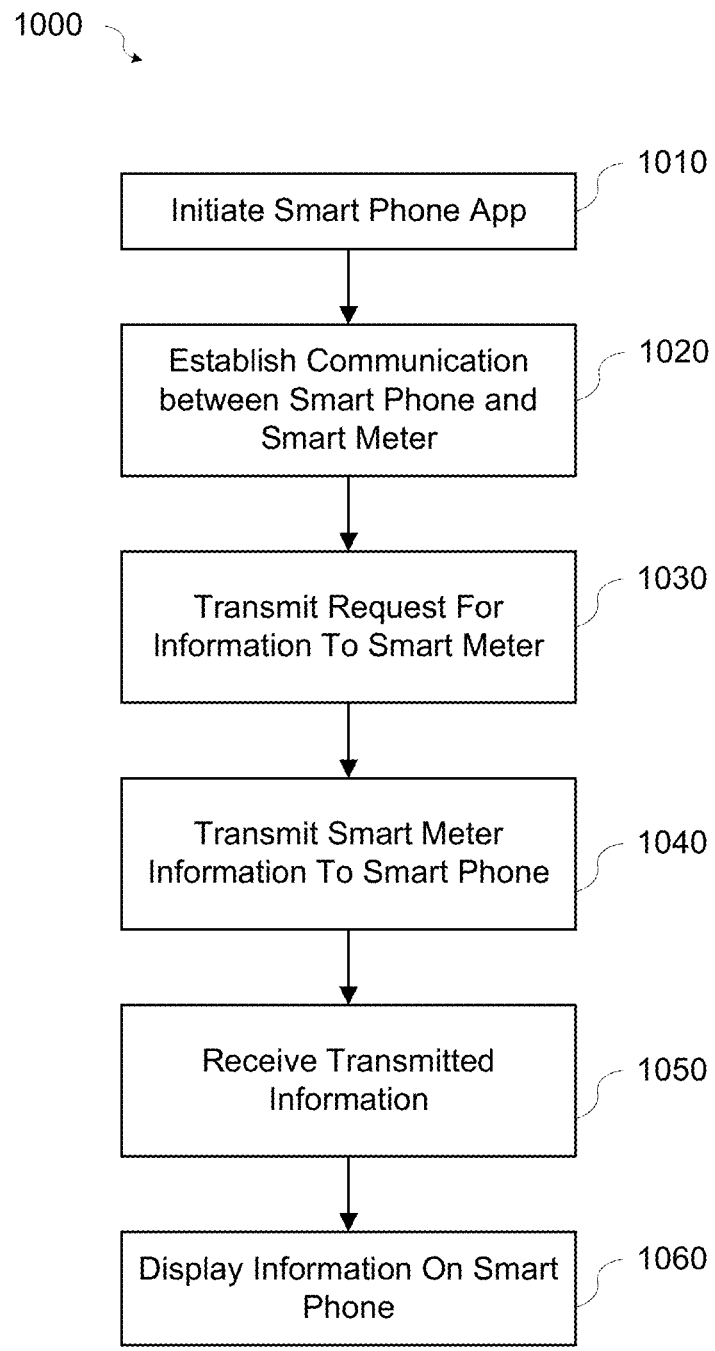
FIG. 10 is a flowchart illustrating an example of a method 1000 for obtaining information from a smart meter using an application executing on a smart device according to aspects of the present disclosure.

FIG. 10 is a flowchart illustrating an example of a method 1000 for obtaining information from a smart meter using an application executing on a smart device according to aspects of the present disclosure. Referring to FIG. 10, at block 1010, a user may initiate the application (e.g., the application 355) on the smart device.

At block 1020, communication between the smart device application and the smart meter may be established. The application may enable the smart device to communicate with the smart meter, for example, via the communications module using Wifi or another wireless communication technology or protocol, or via the NFC module using RFID or another NFC communication technology or protocol.

At block 1030, the smart device application may cause the smart device to transmit a request for information to the smart meter.

At block 1040, the smart meter may transmit the information to the smart device. The information provided by the smart meter may include operational information (e.g., energy usage, phase voltages, current, power factor, etc.), as well as other smart meter information (e.g., GPS coordinates, temperature, error indications or codes, etc.) stored locally, for example, in the memory of the smart meter.

At block 1050, the smart device may receive the information transmitted by the smart meter.

At block 1060, the smart device application may cause the information to be presented on the display of the smart device. The information may be displayed, for example, as shown in FIG. 8.

It should be appreciated that the specific operations illustrated in FIG. 10 provide a particular method for obtaining information from a smart meter according to an embodiment of the present invention. Other sequences of operations may also be performed according to alternative embodiments. For example, alternative embodiments of the present invention may perform the operations outlined above in a different order. Moreover, the individual operations illustrated in FIG. 10 may include multiple sub-operations that may be performed in various sequences as appropriate to the individual operation. Furthermore, additional operations may be added or removed depending on the particular applications. One of ordinary skill in the art would recognize many variations, modifications, and alternatives.

The methods 900 and 1000, respectively, may be embodied on a non-transitory computer readable medium, for example, but not limited to, a memory or other non-transitory computer readable medium known to those of skill in the art, having stored therein a program including computer executable instructions for making a processor, computer, or other programmable device execute the operations of the methods.

In some cases, the smart meter may transmit an error notification to the server of the head-end system or other remote computer system, or customer may indicate problem with their service. Based on the smart meter identification information transmitted by the smart meter or the address reported by the customer, location information, for example, GPS coordinates, address of the smart meter installation, etc., may be obtained from the database of smart meter information maintained at the head-end system or other remote computer system.

The error notification or customer problem together with the meter identification and location information may be transmitted by the head-end system or other remote computer system to a smart device executing an application for locating the smart meter. The smart device application may cause the smart device to execute a navigation program to direct the user to the location, for example, a map to a street address, where the smart meter is located. The smart device application may use the GPS coordinates of the smart meter to direct the user to the actual location of the meter at the street address.

It should be appreciated that any of the features or aspects of the several embodiments may be combined into one embodiment without departing from the scope of the present disclosure.

The examples and embodiments described herein are for illustrative purposes only. Various modifications or changes in light thereof will be apparent to persons skilled in the art. These are to be included within the spirit and purview of this application, and the scope of the appended claims, which follow.

What is claimed is:

1. A method for programming global positioning system (GPS) coordinates for a smart meter, the method comprising:

receiving, by a server remote from the smart meter, an image file of a photograph of the smart meter;
recognizing identification information of the smart meter from the image file;

extracting GPS coordinates from metadata of the received image file;

transmitting the GPS coordinates and instructions to store the GPS coordinates to the smart meter identified by the identification information; and storing, by a processor of the smart meter, the GPS coordinates in a memory of the smart meter.

2. The method of claim 1, wherein the recognizing the identification information of the smart meter comprises performing image recognition on the received image file.

3. The method of claim 1, further comprising:

storing the GPS coordinates in a database record associated with the identification information of the smart meter.

4. The method of claim 1, wherein the photograph of the smart meter is captured by a camera on a smart device, and an application executing on the smart device causes the image file to be transmitted to the server.

5. The method of claim 4, wherein the smart device communicates with the server via Internet or cellular service.

6. The method of claim 1, wherein the identification information of the smart meter comprises an identification number in a form of an alphanumeric code, a barcode, or a Quick Response (QR) code.

7. The method of claim 1, further comprising:

prior to transmitting the GPS coordinates and instructions:

determining that the smart meter has not joined an Advanced Metering Infrastructure (AMI) network; and delaying transmission of the GPS coordinates and instructions until the smart meter joins the AMI network.

8. A system, comprising:

a smart device operable to execute an application;

a smart meter including a processor and a memory; and a remote server operable to communicate with the smart device and the smart meter, the remote server configured to:

receive, from an application executing on the smart device, an image file of a photograph of the smart meter;

recognize identification information of the smart meter from the image file;

extract GPS coordinates from metadata of the image file; and transmit the GPS coordinates and instructions to store the GPS coordinates to the smart meter identified by the identification information, wherein the processor of the smart meter is configured to store the GPS coordinates in the memory of the smart meter.

9. The system of claim 8, wherein the remote server is further configured to perform image recognition on the received image file to recognize the identification information of the smart meter.

10. The system of claim 8, wherein the remote server is further configured to store the GPS coordinates in a database record associated with the identification information of the smart meter.

11. The system of claim 8, wherein the photograph of the smart meter is captured by a camera on the smart device, and the application executing on the smart device causes the image file to be transmitted to the remote server.

12. The system of claim 11, the smart device communicates with the remote server via Internet or cellular service.

13. The system of claim 8, wherein the identification information of the smart meter comprises an identification number in a form of an alphanumeric code, a barcode, or a Quick Response (QR) code.

14. The system of claim 8, wherein the smart meter and the remote server communicate via an Advanced Metering Infrastructure (AMI) network.

15. The system of claim 14, wherein prior to transmitting the GPS coordinates and instructions, the remote server is further configured to:

determine that the smart meter has not joined the AMI network; and delay transmission of the GPS coordinates and instructions until the smart meter joins the AMI network.

16. A non-transitory computer readable medium having stored therein instructions for making a processor of a remote computer system execute a method for programming GPS coordinates for a smart meter, the processor executable instructions comprising instructions for performing operations including:

receiving an image file of a photograph of the smart meter;

recognizing identification information of the smart meter from the image file;

extracting GPS coordinates from metadata of the image file; and transmitting the GPS coordinates and instructions to store the GPS coordinates to the smart meter identified by the identification information.

17. The non-transitory computer readable medium as defined in claim 16, further comprising instructions for performing operations including:

performing image recognition on the received image file to recognize the identification information of the smart meter.

18. The non-transitory computer readable medium as defined in claim 16, further comprising instructions for performing operations including:

storing the GPS coordinates in a database record associated with the identification information of the smart meter.

19. The non-transitory computer readable medium as defined in claim 16, wherein the identification information of the smart meter comprises an identification number in a form of an alphanumeric code, a barcode, or a Quick Response (QR) code.

20. The non-transitory computer readable medium as defined in claim 16, further comprising instructions for performing operations including:

prior to transmitting the GPS coordinates and instructions:

determining that the smart meter has not joined an Advanced Metering Infrastructure (AMI) network; and delaying transmission of the GPS coordinates and instructions until the smart meter joins the AMI network.

* * * * *